US012772699B2

(12) United States Patent
Chen

(10) Patent No.: US 12,772,699 B2
(45) Date of Patent: Oct. 20, 2026

(54) DISPLAY PANEL AND DISPLAY DEVICE

(71) Applicant: Wuhan China Star Optoelectronics Semiconductor Display Technology Co., Ltd., Wuhan (CN)

(72) Inventor: Chen Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 613 days.

(21) Appl. No.: 17/772,643

(22) PCT Filed: Apr. 20, 2022

(86) PCT No.: PCT/CN2022/087792
§ 371 (c)(1),
(2) Date: Apr. 28, 2022

(87) PCT Pub. No.: WO2023/193296
PCT Pub. Date: Oct. 12, 2023

(65) Prior Publication Data
US 2024/0172529 A1 May 23, 2024

(30) Foreign Application Priority Data
Apr. 7, 2022 (CN) ......................... 202210364738.0

(51) Int. Cl.
*H10K 59/80* (2023.01)
*H10K 59/124* (2023.01)

(52) U.S. Cl.
CPC ......... *H10K 59/873* (2023.02); *H10K 59/124* (2023.02)

(58) Field of Classification Search
CPC ............... H10K 59/873; H10K 59/124; H10K 59/8722; Y02E 10/549
See application file for complete search history.

(56) References Cited

U.S. PATENT DOCUMENTS

2004/0150867 A1 8/2004 Lee et al.
2020/0044190 A1 2/2020 Luo
(Continued)

FOREIGN PATENT DOCUMENTS

CN 109802052 5/2019
CN 112117321 12/2020
(Continued)

OTHER PUBLICATIONS

International Search Report and the Written Opinion Dated Dec. 16, 2022 From the International Searching Authority Re. Application No. PCT/CN2022/007792 and Its Translation Into English. (17 Pages).

(Continued)

*Primary Examiner* — Vongsavanh Sengdara

(57) ABSTRACT

A display panel and a display device are provided. The display device includes a photosensitive device and the display panel. The display panel includes a base substrate, a driver circuit layer, a column spacer, a light-emitting layer, and a first inorganic encapsulation layer forming a protruding structure corresponding to the column spacer to increase thickness of the first inorganic encapsulation layer, so that an encapsulation effect of the first inorganic encapsulation layer is improved and a risk of moisture intrusion into a display area which renders a light-emitting material failed can be reduced.

18 Claims, 6 Drawing Sheets

(56) References Cited

U.S. PATENT DOCUMENTS

| | | | | |
|---|---|---|---|---|
| 2022/0045300 | A1* | 2/2022 | He | H10K 59/1213 |
| 2022/0069045 | A1* | 3/2022 | Ebisuno | H10D 86/0212 |

FOREIGN PATENT DOCUMENTS

| | | |
|---|---|---|
| CN | 21782041 | 7/2021 |
| CN | 113270462 | 8/2021 |
| CN | 113497200 | 10/2021 |
| CN | 113745269 | 12/2021 |
| CN | 114039015 | 2/2022 |
| CN | 114122029 | 3/2022 |
| CN | 114207860 | 3/2022 |
| WO | WO 2021/227027 | 11/2021 |

OTHER PUBLICATIONS

Notification of Office Action and Search Report Dated Dec. 20, 2022 From the State Intellectual Property Office of the People's Republic of China Re. Application No. 202210364738.0 and Its Translation Into English. (13 Pages).

* cited by examiner

DISPLAY PANEL AND DISPLAY DEVICE

RELATED APPLICATIONS

This application is a National Phase of PCT Patent Application No. PCT/CN2022/087792 having International filing date of Apr. 20, 2022, which claims the benefit of priority of Chinese Patent Application No. 202210364738.0 filed on Apr. 7, 2022. The contents of the above applications are all incorporated by reference as if fully set forth herein in their entirety.

FIELD AND BACKGROUND OF THE INVENTION

The present application relates to a technical field of displays, and particularly to a display panel and a display device.

Organic light-emitting diode (OLED) display technologies are a sort of self-luminous display technologies that do not require backlight and have advantages of high brightness, low power consumption, wide viewing angles, and quick response times, so they have been widely used in mobile phone industries. In addition to display surfaces, display panels are also equipped with components, such as cameras, earpieces, microphones, and circuits, which also take up a considerable portion of screens. How to effectively increase screen ratios of the display surfaces and improve aesthetics of the display panels has become a mainstream design at present.

Currently, forming grooves by digging edges of photosensitive areas of base substrates to force common layers to be broken at the grooves is commonly used in products on the markets to prevent moisture from laterally intruding to pass through the common layers. Although this design can minimize a risk of the lateral intrusion of moisture, it increases a path for vertical intrusion of moisture from the base substrates. Since portions of the base substrates in the photosensitive areas are completely exposed to high humidity environment after cutting, moisture can easily enter from sides of the base substrates and accumulate in base substrate materials under the grooves. Moisture can enter display areas through gaps, pinholes, cracks, etc. of inorganic film layers, resulting in display defects, such as the failure of light-emitting materials in light-emitting layers and black spots in the display areas. In addition, inconsistent structures (such as depth, width, etc.) of the grooves will also affect quality of thin films formed by encapsulation layers deposited in the grooves, thereby negatively affecting encapsulation effects, increasing probability of hole blackboard phenomenon, and seriously influencing product quality.

Accordingly, current display panels have the problem that moisture can laterally intrude into the display areas through openings of the base substrates in the photosensitive areas, resulting in poor display such as hole black spots. Therefore, it is imperative to provide a display panel and a display device to improve this defect.

SUMMARY OF THE INVENTION

An embodiment of the present application provides a display panel, including a photosensitive area, a transition area surrounding at least part of the photosensitive area, and a display area surrounding at least part of the transition area, and the display panel further including a base substrate; a driver circuit layer disposed on the base substrate; at least a column spacer disposed on the base substrate and located in the transition area; a light-emitting layer disposed on a side of the driver circuit layer away from the base substrate and covering the transition area, wherein the light-emitting layer is broken at the column spacer; and a first inorganic encapsulation layer disposed on a side of the light-emitting layer away from the base substrate, wherein the first inorganic encapsulation layer covers the display area and extends to the transition area and at least covers the column spacer. The column spacer comprises a first metal structure, an insulating layer, and a second metal structure that are sequentially laminated on the base substrate, and at least one side of the second metal structure defines a notch. An area of the first metal structure is larger than that of the second metal structure, and the first inorganic encapsulation layer defines a protruding structure corresponding to an edge of the first metal structure.

According to one embodiment of the present application, the first metal structure includes a main body portion disposed overlapping the second metal structure and an extending portion extending from the main body portion. A difference value between a distance between an upper surface of the insulating layer at the extending portion and an upper surface of the base substrate and a distance between an upper surface of the insulating layer located between adjacent ones of the first metal structures and the upper surface of the base substrate is greater than a thickness of the first metal structure.

According to one embodiment of the present application, a thickness of the insulating layer at the extending portion is greater than a thickness of the insulating layer at the main portion.

According to one embodiment of the present application, a difference value between a distance between an upper surface of the insulating layer at the main body portion and the upper surface of the base substrate and the distance between the upper surface of the insulating layer located between adjacent ones of the first metal structures and the upper surface of the base substrate is equal to the thickness of the first metal structure.

According to one embodiment of the present application, the driver circuit layer includes a semiconductor layer, a first gate metal layer, a first gate insulating layer, a second gate metal layer, a second gate insulating layer, a first metal layer, and a second metal layer all sequentially laminated on the base substrate. The first metal structure is disposed in a same layer as the first gate metal layer or the second gate metal layer, and the second metal structure is disposed in a same layer as the first metal layer or the second metal layer.

According to one embodiment of the present application, the driver circuit layer includes a shielding metal layer, a semiconductor layer, a first gate metal layer, a first gate insulating layer, a second gate metal layer, a second gate insulating layer, a first metal layer, and a second metal layer that are sequentially laminated on the base substrate. The first metal structure and one of the shielding metal layer, the first gate metal layer, and the second gate metal layer are disposed in a same layer, and the second metal structure is disposed in a same layer as the first metal layer or the second metal layer.

According to one embodiment of the present application, the smaller a distance between the first metal structure and the second metal structure is, the greater a thickness of the protruding structure is.

According to one embodiment of the present application, the second metal structure comprises a first metal material layer, a second metal material layer, and a third metal material layer sequentially laminated together, wherein a width of the second metal material layer is less than a width of the first metal material layer and a width of the third metal material layer, respectively.

According to one embodiment of the present application, the display panel includes a retaining wall disposed on the base substrate and located in the transition area. The column spacer is disposed relative to each of a side of the retaining wall close to the display area and a side of the retaining wall away from the display area.

According to one embodiment of the present application, a distance between an upper surface of the column spacer disposed relative to the side of the retaining wall close to the display area and an upper surface of the base substrate is equal to a distance between an upper surface of the column spacer disposed relative to the side of the retaining wall away from the display area and the upper surface of the base substrate.

According to one embodiment of the present application, the display panel further includes an organic encapsulation layer and a second inorganic encapsulation layer sequentially laminated on the first inorganic encapsulation layer, wherein the organic encapsulation layer is disposed relative to the side of the retaining wall close to the display area. Part of the second inorganic encapsulation layer is disposed flat on the organic encapsulation layer relative to the side of the retaining wall close to the display area, and part of the second inorganic encapsulation layer is disposed on the first inorganic encapsulation layer relative to the side of the retaining wall away from the display area, wherein the second inorganic encapsulation layer defines an auxiliary protruding structure corresponding to the protruding structure.

According to one embodiment of the present application, a thickness of the auxiliary protruding structure is less than a thickness of the protruding structure.

According to one embodiment of the present application, the base substrate and the driver circuit layer together define a through hole in the photosensitive area.

According to a display panel provided by one embodiment of the present application, embodiments of the present application further provide a display device, including a photosensitive device and a display panel including a photosensitive area, a transition area surrounding at least part of the photosensitive area, and a display area surrounding at least part of the transition area. The display panel further includes a base substrate; a driver circuit layer disposed on the base substrate; at least a column spacer disposed on the base substrate and located in the transition area; a light-emitting layer disposed on a side of the driver circuit layer away from the base substrate and covering the transition area, wherein the light-emitting layer is broken at the column spacer; and a first inorganic encapsulation layer disposed on a side of the light-emitting layer away from the base substrate, wherein the first inorganic encapsulation layer covers the display area and extends to the transition area and at least covers the column spacer. The column spacer includes a first metal structure, an insulating layer, and a second metal structure that are sequentially laminated on the base substrate, and at least one side of the second metal structure defines a notch. An area of the first metal structure is larger than that of the second metal structure, and the first inorganic encapsulation layer defines a protruding structure corresponding to an edge of the first metal structure.

According to one embodiment of the present application, the first metal structure includes a main body portion disposed overlapping the second metal structure and an extending portion extending from the main body portion. A difference value between a distance between an upper surface of the insulating layer at the extending portion and an upper surface of the base substrate and a distance between an upper surface of the insulating layer located between adjacent ones of the first metal structures and the upper surface of the base substrate is greater than a thickness of the first metal structure.

According to one embodiment of the present application, a thickness of the insulating layer at the extending portion is greater than a thickness of the insulating layer at the main portion.

According to one embodiment of the present application, a difference value between a distance between an upper surface of the insulating layer at the main body portion and the upper surface of the base substrate and the distance between the upper surface of the insulating layer located between adjacent ones of the first metal structures and the upper surface of the base substrate is equal to the thickness of the first metal structure.

According to one embodiment of the present application, the driver circuit layer includes a semiconductor layer, a first gate metal layer, a first gate insulating layer, a second gate metal layer, a second gate insulating layer, a first metal layer, and a second metal layer all sequentially laminated on the base substrate. The first metal structure is disposed in a same layer as the first gate metal layer or the second gate metal layer, and the second metal structure is disposed in a same layer as the first metal layer or the second metal layer.

According to one embodiment of the present application, the driver circuit layer includes a shielding metal layer, a semiconductor layer, a first gate metal layer, a first gate insulating layer, a second gate metal layer, a second gate insulating layer, a first metal layer, and a second metal layer that are sequentially laminated on the base substrate. The first metal structure and one of the shielding metal layer, the first gate metal layer, and the second gate metal layer are disposed in a same layer, and the second metal structure is disposed in a same layer as the first metal layer or the second metal layer.

According to one embodiment of the present application, the smaller a distance between the first metal structure and the second metal structure is, the greater a thickness of the protruding structure is.

The embodiments of the present disclosure have advantageous effects as follows: the embodiments of the present application provide a display panel and a display device. The display device includes a photosensitive area, a transition area surrounding the photosensitive area, and a display area surrounding the transition area. The display panel further includes a base substrate, a driver circuit layer, a column spacer, a light-emitting layer, and a first inorganic encapsulation layer. The light-emitting layer is broken at the column spacer in the transition area to prevent moisture from passing through the light-emitting layer in the transition area to permeate into the display area. The column spacer includes a first metal structure, an insulating layer, and a second metal structure that are sequentially laminated on the base substrate. At least one side of the second metal structure forms a notch. An area of the first metal structure is larger than that of the second metal structure, and the first inorganic encapsulation layer forms a protruding structure corresponding to an edge of the first metal structure. The protruding structure can increase a thickness of the first inorganic encapsulation layer relative to the column spacer, so that an encapsulation effect of the first inorganic encapsulation layer can be enhanced, and a risk of moisture intrusion into the display area AA which renders a light-emitting material failed can be reduced.

BRIEF DESCRIPTION OF THE SEVERAL VIEWS OF THE DRAWINGS

In order to illustrate the technical solutions more clearly in the embodiments of the present invention, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF SPECIFIC EMBODIMENTS OF THE INVENTION

Figure 1:
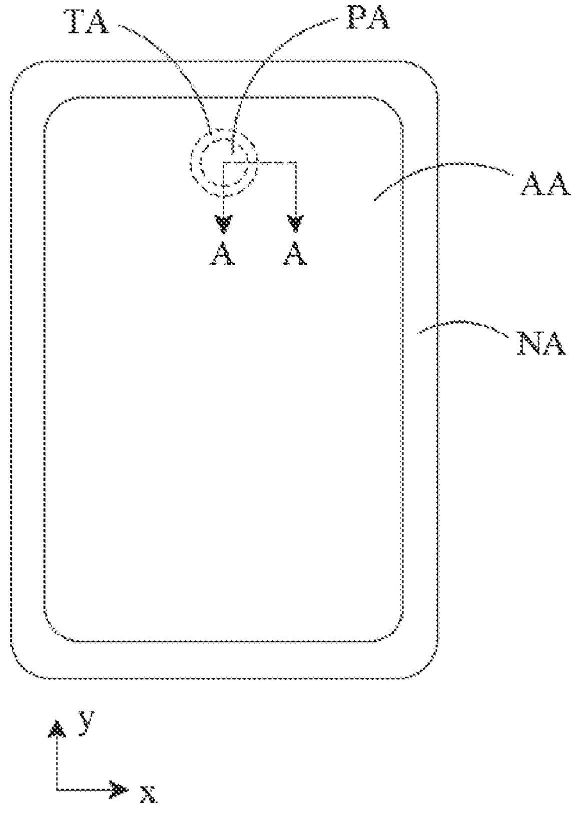
FIG. 1 is a schematic structural view of a display panel according to an embodiment of the present application.

The following embodiments are referring to the accompanying drawings for exemplifying specific implementable embodiments of the present disclosure. Directional terms described by the present invention, such as upper, lower, front, back, left, right, inner, outer, side, etc., are only directions by referring to the accompanying drawings, and thus the directional terms as used are intended to describe and understand the present disclosure, but the present disclosure is not limited thereto. In the drawings, units with similar structures are indicated by the same reference numerals.

The disclosure will be further described below in conjunction with the accompanying drawings and specific embodiments:

An embodiment of the present application provides a display panel, as shown in FIG. 1, which is a schematic structural view of a display panel according to an embodiment of the present application, the display panel includes a photosensitive area PA, a transition area TA surrounding at least part of the photosensitive area PA, a display area AA surrounding at least part of the transition area TA, and a non-display area NA arranged on a periphery of the display area AA.

In the embodiment of the present application, the photosensitive area PA is circular in shape, the transition area TA is annular in shape and is arranged around the photosensitive area PA, and the display area AA is arranged around the transition area TA. In some other embodiments, the photosensitive area PA may also be oval in shape, teardrop-like in shape, or irregular in shape. At least a side of the photosensitive area PA can be attached to the non-display area NA, the transition area TA may be disposed around part of the photosensitive area PA, and the display area AA may be disposed around part of the transition area TA.

The display area AA is configured to achieve a function of image display. For example, the display area AA may be provided with a plurality of pixels arranged in an array for emitting light. The pixels can emit light under driving of a pixel driving circuit, so as to achieve the function of image display. The photosensitive area PA can be configured to obtain and sense external light. For example, a photosensitive device may be provided opposite to the photosensitive area PA. The photosensitive device can obtain light of external environment, and then convert the obtained light into corresponding electrical signals and transmit the electrical signals to a processor for processing. The photosensitive device may include, but is not limited to, a camera. By installing the camera in the photosensitive area PA, functions of under-screen camera shooting or face recognition can be realized.

It should be noted that in the following, a first direction x is a width direction of the display panel, a second direction y is a length direction of the display panel, a third direction z is a thickness direction of the display panel, and a third direction z is perpendicular to the first direction x and the second direction y.

Figure 2:
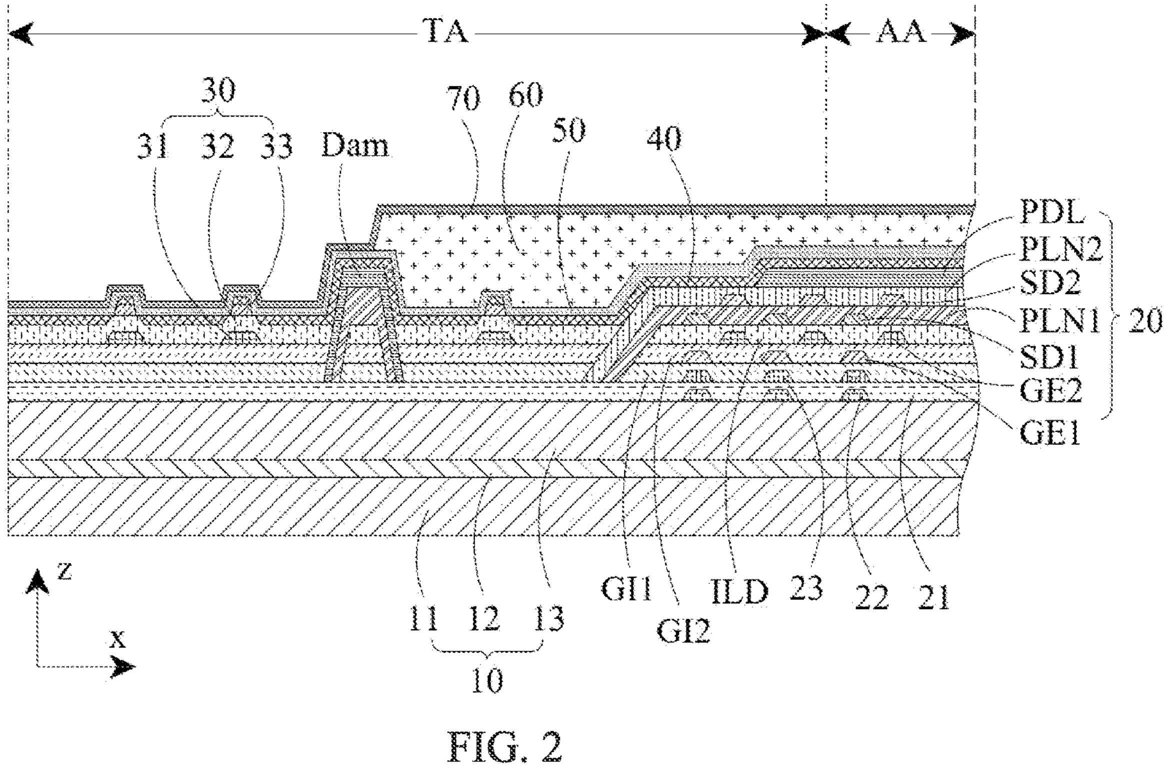
FIG. 2 is a schematic cross-sectional view of a first type of a display panel in an A-A direction according to an embodiment of the present application.

As shown in FIG. 2, which is a schematic cross-sectional view of a first type of a display panel along an A-A direction according to an embodiment of the present application, the display panel includes a base substrate 10, a driver circuit layer 20, at least a column spacer 30, a light-emitting layer 40, and a first inorganic encapsulation layer 50. The driver circuit layer 20 is disposed on the base substrate 10.

The column spacer 30 is disposed on the base substrate 10 and is located in the transition area TA. It should be noted that, being disposed on the base substrate 10 may refer to direct contact or indirect contact with a surface of the base substrate 10.

The base substrate 10 and the driver circuit layer 20 together form a through hole in the photosensitive area PA. A shape of the through hole may be any one including, but not limited to, a circle, an ellipse, a teardrop shape, or an irregular shape.

A plurality of the column spacers 30 may be arranged on the base substrate 10. The column spacers 30 are annular in shape on a plane parallel to the first direction x and the second direction y, and the column spacers 30 may be disposed around a periphery of the photosensitive area PA layer by layer. In some other embodiments, a number of the column spacer 30 is not limited to the above-mentioned multiple ones, and only one column spacer 30 may be provided. The number of the column spacer 30 can be set according to sizes of the transition area TA and actual requirements, and is not limited here.

The light-emitting layer 40 is disposed on a side of the driver circuit layer 20 away from the base substrate 10 and covering the transition area TA. When covering the transition area TA, the light-emitting layer 40 is broken at the column spacer 30.

The light-emitting layer 40 includes, but is not limited to, a hole injection layer, a hole transport layer, an organic light-emitting material layer, an electron transport layer, and an electron injection layer that are sequentially laminated together. The hole injection layer, the hole transport layer, the electron transport layer, and the electron injection layer are all prepared by a whole surface evaporation process and cover both the display area AA and the transition area TA. The organic light-emitting material layer can be prepared by an inkjet printing process and is only formed in the display area AA.

In the transition area TA, part of the light-emitting layer 40 may be deposited on a surface of the column spacer 30 away from the base substrate 10, another part of the light-emitting layer 40 may be deposited on a surface where the column spacer 30 is located. Due to a level difference formed by the column spacer 30, the part of the light-emitting layer 40 on the column spacer 30 can be broken from the other part of the light-emitting layer 40, thus preventing moisture in the environment from diffusing into the light-emitting layer 40 in the display area AA through the light-emitting layer 40 in the transition area TA, so that a risk of moisture intrusion into the display area AA which renders a light-emitting material failed can be reduced.

The first inorganic encapsulation layer 50 is disposed on a side of the light-emitting layer 40 away from the base substrate 10 in order to provide a shielding protection for the light-emitting layer 40, thereby further reducing the risk of the moisture intrusion into the light-emitting layer which renders the light-emitting material failed.

Further, the base substrate 10 is formed by stacking organic materials and inorganic materials in sequence.

In the embodiment of this application, the base substrate 10 includes a first organic layer 11, an inorganic layer 12 disposed on the first organic layer 11, and a second organic layer 13 disposed on a side of the inorganic layer 12 away from the first organic layer. The driver circuit layer 20 may be disposed on a side of the second organic layer 13 away from the inorganic layer 12.

The first organic layer 11 and the second organic layer 13 are both made of organic materials. The organic materials may include, but is not limited to, one or a mixture of polyimide (PI), polyamide (PA), polycarbonate (PC), polyphenylene ether sulfone (PES), polyethylene terephthalate (PET), polyethylene naphthalate (PEN), polymethyl methacrylate (PMMA), of cyclic olefin copolymer (COC).

Preferably, the first organic layer 11 and the second organic layer 13 are made of a same material. In some other embodiments, the first organic layer 11 and the second organic layer 13 may also be prepared using different organic materials.

The inorganic layer 12 is made of an inorganic material, which may include, but is not limited to, any one or a mixture of silicon nitride, silicon oxide, or silicon oxynitride. Inorganic materials have good moisture barrier capability. The inorganic layer 12 can separate the first organic layer 11 from the second organic layer 13 to prevent the moisture from intruding into the light-emitting layer 40 in the display area through the first organic layer 11 and the second organic layer 13.

In some other embodiments, the structure of the base substrate 10 is not limited to a three-layered structure formed by sequentially laminating the first organic layer 11, the inorganic layer 12, and the second organic layer 13 in the above embodiments. The base substrate 10 may also be a single-layered structure formed by a layer of organic material or a layer of inorganic material, or may also be a multilayer structure formed by superimposing at least one layer of the organic material and at least one layer of the inorganic material.

Further, the column spacer 30 includes a first metal structure 31, an inorganic insulating layer 32, and a second metal structure 33 that are sequentially laminated on the base substrate 10.

Figure 3:
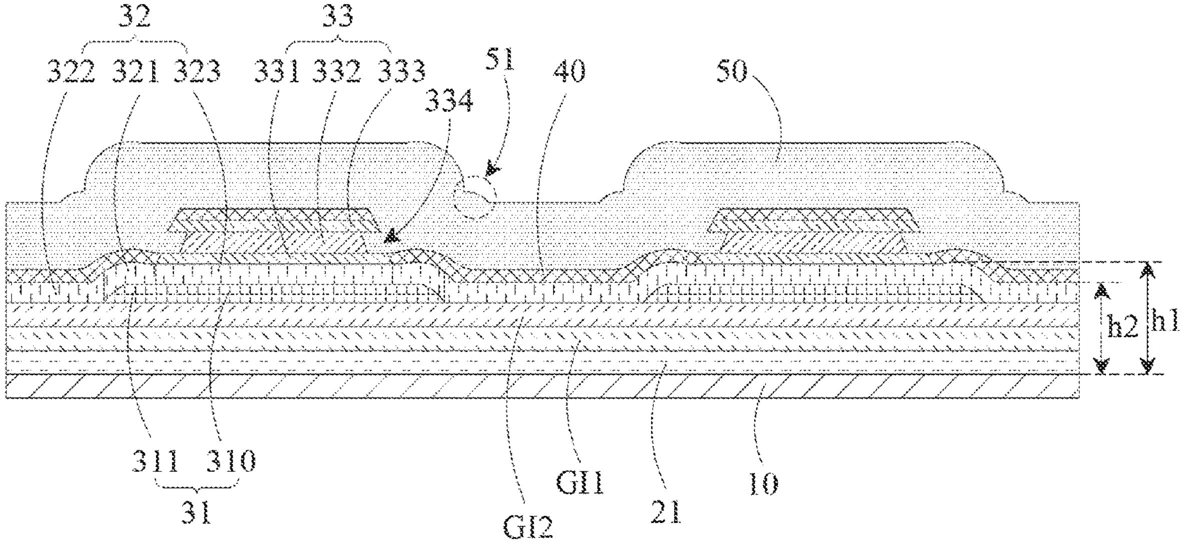
FIG. 3 is a schematic structural view of a first type of a column spacer according to an embodiment of the present application.

As shown in FIG. 3, FIG. 3 is a schematic structural view of a first type of a column spacer according to an embodiment of the present application. The second metal structure 33 includes a first metal material layer 331, a second metal material layer 332, and a third metal material layer 333 sequentially laminated on a side of the inorganic insulating layer 32 away from the first metal structure 31. A surface of the third metal material layer 333 away from the first metal material layer 331 forms a top surface of the column spacer 30.

In a process of fabricating the second metal structure 33, the first metal material layer 331, the second metal material layer 332, and the third metal material layer 333 may be formed by sequentially depositing, and an etching process is then used to form the second metal structure 33. Since a chemical etching rate of the second metal material layer 332 is higher than that of the first metal material layer 331 and the third metal material layer 333, an etching degree of the second metal material layer 332 is greater than that of the first metal material layer 331 and the third metal material layer 333. As a result, an edge of the second metal material layer 332 in contact with a chemical agent shrinks toward a middle, resulting in a width of the second metal material layer 332 less than each of a width of the first metal material layer 331 and a width of the third metal material layer 333, so that a peripheral edge of the second metal material layer 332 forms a notch 334.

In one embodiment, a depth of the notch 334 may be greater than or equal to 0.2 microns (μm) and less than or equal to 0.5 μm. For example, the depth of the notch 334 may be, but not limited to, 0.2 μm, 0.3 μm, 0.4 μm, or 0.5 μm, and the like.

During a process of forming the light-emitting layer 40 by vapor deposition on an entire surface, since peripheral edges of the third metal material layer 333 shield the notch 334 below, a material of the light-emitting layer 40 cannot be deposited on sidewalls of the column spacer 30, resulting in a disconnection between the light-emitting layer 40 formed on a top surface of the column spacer 30 and the light-emitting layer 40 formed on a bottom periphery of the column spacer 30.

The second metal material layer 332 may be made of aluminum (Al). Materials of the first metal material layer 331 and the third metal material layer 333 may include, but are not limited to, titanium (Ti) or molybdenum (Mo). If the chemical etching rate of the second metal material layer 332 is higher than that of the first metal material layer 331 and the third metal material layer 333, requirements of the second metal structure 33 are satisfied.

Preferably, the first metal material layer 331 and the third metal material layer 333 are made of a same material. In some other embodiments, the first metal material layer 331 and the third metal material layer 333 may also include different materials.

In the embodiment of the present application, as shown in FIG. 3, an area of the first metal structure 31 is larger than that of the second metal structure 33, and the first inorganic encapsulation layer 50 defines a protruding structure 51 corresponding to an edge of the first metal structure 31.

Further, the first metal structure 31 includes a main body 310 portion disposed facing the second metal structure 33 and an extending portion 311 extending from the main body portion 310.

As shown in FIG. 3, an orthographic projection of the main body 310 on the base substrate 10 coincides with an orthographic projection of the second metal structure 33 on the base substrate 10. The extending portion 311 extends from the main body portion 310 and has an orthographic projection on the base substrate 10 separate from the orthographic projection of the second metal structure 33 on the base substrate 10.

The inorganic insulating layer 32 is disposed on the base substrate 10 and covers a side surface of the first metal structure 31 away from the base substrate 10. The second metal structure 33 is disposed on a side surface of the inorganic insulating layer 32 facing away from the first metal structure 31. It should be noted that the disposition on the base substrate 10 may refer to direct contact with a surface of the base substrate 10 or indirect contact with the surface of the base substrate 10.

Further, the inorganic insulating layer 32 includes a first portion 321 disposed on the extending portion 311 of the first metal structure 31, a second portion 322 disposed adjoining the first metal structure 31, and a third portion 323 disposed on the main body portion 310. The first portion 321 is connected to the second portion 322 and the third portion 323, respectively.

In the embodiment of the present application, a thickness of the first portion 321 is greater than a thickness of the third portion 323. It should be noted that the inorganic insulating layer 32 may be prepared and formed by using an inorganic material through chemical vapor deposition (CVD). During the chemical vapor deposition process, more inorganic material will be deposited on the extending portion 311 of the first metal structure 31, resulting in the thickness of the first portion 321 deposited on the extending portion 311 greater than a thickness of the second portion 322 deposited on the base substrate 10.

The light-emitting layer 40 is deposited on the first portion 321 and the second portion 322 of the inorganic insulating layer 32 in the transition area TA. The thickness of the light-emitting layer 40 is relatively thin and cannot fill a height difference between the first portion 321 and the second portion 322 on a side away from the base substrate 10. The first inorganic encapsulation layer 50 is disposed on a surface of the light-emitting layer 40 away from the base substrate 10. The first inorganic encapsulation layer 50 forms the protruding structure 51 as shown in a dotted frame in FIG. 3 on a side corresponding to the first portion 321 away from the base substrate 10 while filling the notch 334 of the column spacer 30.

The protruding structure 51 protrudes from part of a surface of the first inorganic encapsulation layer 50 located facing a side of the light-emitting layer 40 corresponding to the second portion 322 away from the base substrate 10 to increase a thickness of the first inorganic encapsulation layer 50 relative to a side wall of the first column spacer 30, thereby improving moisture barrier performance of the first inorganic encapsulation layer 50.

Further, a difference value between a distance between an upper surface of the first portion 321 and an upper surface of the base substrate 10 and a distance between an upper surface of the second portion 322 and the upper surface of the base substrate 10 is greater than a thickness of the first metal structure 31.

As shown in FIG. 3, the upper surface of the first portion 321 refers to a side surface of the first portion 321 away from the base substrate 10, and the upper surface of the second portion 322 refers to a side surface of the second portion 322 away from the base substrate 10. The distance between the upper surface of the first portion 321 and the upper surface of the base substrate 10 is h1, the distance between the upper surface of the second portion 322 and the upper surface of the base substrate 10 is h2, and the distance h1 is greater than the distance h2. A difference value between h1 and h2 is greater than the thickness of the first metal structure 31, thereby preventing the inorganic material from filling the height difference between the first portion 321 and the second portion 322, so that the first inorganic encapsulation layer 50 can form the protruding structure 51 corresponding to the first portion 321.

An upper surface of the third portion 323 refers to a side surface of the third portion 323 away from the base substrate 10. A difference value between a distance between the upper surface of the third portion 323 and the upper surface of the base substrate 10 and a distance between the upper surface of the second portion 322 and the upper surface of the base substrate 10 is equal to the thickness of the first metal structure 31. That is, a thickness of the third portion 323 of the inorganic insulating layer 32 formed on the main body portion 310 is equal to the thickness of the second portion 322.

The driver circuit layer 20 includes a buffer layer 21, a first gate insulating layer GI1, a first gate metal layer GE1, a second gate insulating layer GI2, a second gate metal layer GE2, an interlayer dielectric layer ILD, a first metal layer SD1, a first planarization layer PLN1, a second metal layer SD2, and a second planarization layer PLN2 all sequentially laminated on the base substrate 10.

The first gate metal layer GE1 may include a plurality of patterned gates and a plurality of scan lines extending in the first direction x and spaced in the second direction y. The second gate metal layer GE2 may include a plurality of metal electrodes disposed facing the gates to form storage capacitors, respectively.

In the embodiment of the present application, each of the first gate metal layer GE1 and the second gate metal layer GE2 may be formed by a single-layered metal film layer made of one of metal materials, such as molybdenum (Mo), copper (Cu), aluminum (Al), titanium (Ti), or silver (Ag). In some other embodiments, the first gate metal layer GE1 and the second gate metal layer GE2 may also be a multilayer metal film structure formed by sequentially laminating two or more of the above materials.

Further, a thickness of each of the first gate metal layer GE1 and the second gate metal layer GE2 is greater than or equal to 1000 angstroms (Å) and less than or equal to 3500 Å.

For example, the thickness of the first gate metal layer GE1 may be 1000 Å, 1500 Å, 2000 Å, 2500 Å, 3000 Å, or 3500 Å, and the thickness of the second gate metal layer GE2 may be 1000 Å, 1500 Å, 2000 Å, 2500 Å, 3000 Å, or 3500 Å, the thickness of the first gate metal layer GE1 and the second gate metal layer GE2 may be the same or different, which are not limited here.

The first metal layer SD1 may include a plurality of patterned source and drain electrodes, and a plurality of data lines extending in the second direction y and spaced in the first direction x. The second metal layer SD2 may include power high voltage signal lines, power low voltage signal lines, reset signal lines, and the like.

Each of the first metal layer SD1 and the second metal layer SD2 may be formed by a single-layered metal film layer made of one of metal materials, such as, Al, Ti, Cu, or Mo, or formed by a multilayer metal film structure formed by two or more than two of the metal materials, such as, Al, Ti, Cu, or Mo, sequentially laminated together.

The materials and structures of the first metal layer SD1 and the second metal layer SD2 may be the same or different, which are not limited herein.

Further, the first metal structure 31 is disposed in a same layer as the first gate metal layer GE1 or the second gate metal layer GE2, and the second metal structure 33 is disposed in a same layer as the first metal layer SD1 or the second metal layer SD2.

In one embodiment, as shown in FIG. 2, the first metal structure 31 is disposed in a same layer as the second gate metal layer GE2 and made of a same material and a same thickness as that of the second gate metal layer GE2. For a material and thickness of the first metal structure 31, please refer to the material and thickness of the second gate metal layer GE2 described above, which will not be repeated here.

The second metal structure 33 is disposed in a same layer as the second metal layer SD2 and made of a same material and a same thickness as that of the second metal layer SD2. For a material and a film layer structure of the second metal layer SD2, please refer to the material and film layer structure of the second metal structure 33 described above, which will not be repeated here.

The second metal layer SD2 and the second metal structure 33 can be prepared and formed by a same metal film forming process. The thicknesses of the second metal layer SD2 and the second metal structure 33 are same and are greater than or equal to 4000 Å and less than or equal to 10000 Å, respectively.

For example, each of the thicknesses of the second metal layer SD2 and the second metal structure 33 may be 4000 Å, 5000 Å, 6000 Å, 7000 Å, 8000 Å, 9000 Å, or 10000 Å.

The inorganic insulating layer 32 is disposed in a same layer as the interlayer dielectric layer ILD and made of a same material and a same thickness as that of the interlayer dielectric layer ILD. The inorganic insulating layer 32 and the interlayer dielectric layer ILD can be formed by using a same inorganic material and prepared by a same vapor deposition process.

It should be noted that the thicker the inorganic insulating layer 32 is, the smaller the height difference between the first portion 321 and the second portion 322 on the side away from the base substrate 10 is, so that a thickness of the protruding structure 51 formed on the first portion 321 of the first inorganic encapsulation layer 50 is also smaller. Since only one layer of inorganic insulating layer 32 formed of inorganic material is disposed between the first metal structure 31 and the second metal structure 33, the protruding structure 51 having a thickness of greater than or equal to 0.1 μm and less than or equal to 0.15 μm can be obtained.

Figure 5:
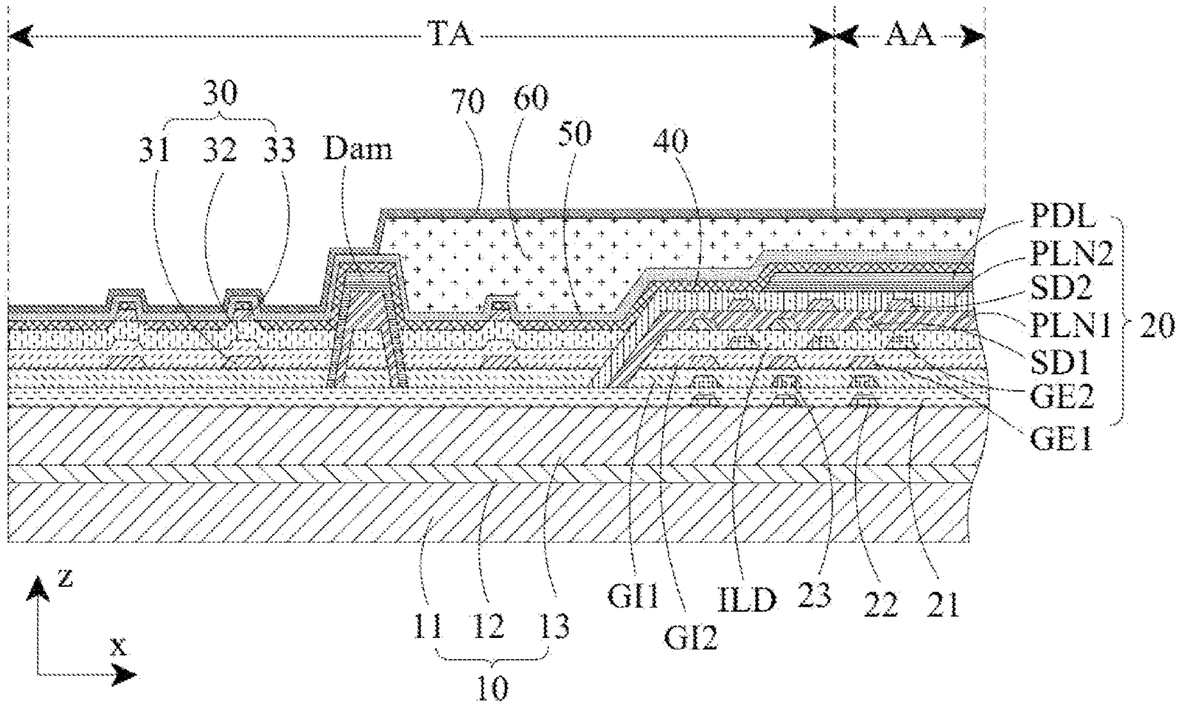
FIG. 5 is a schematic cross-sectional view of a second type of the display panel in the A-A direction according to an embodiment of the present application.
Figure 6:
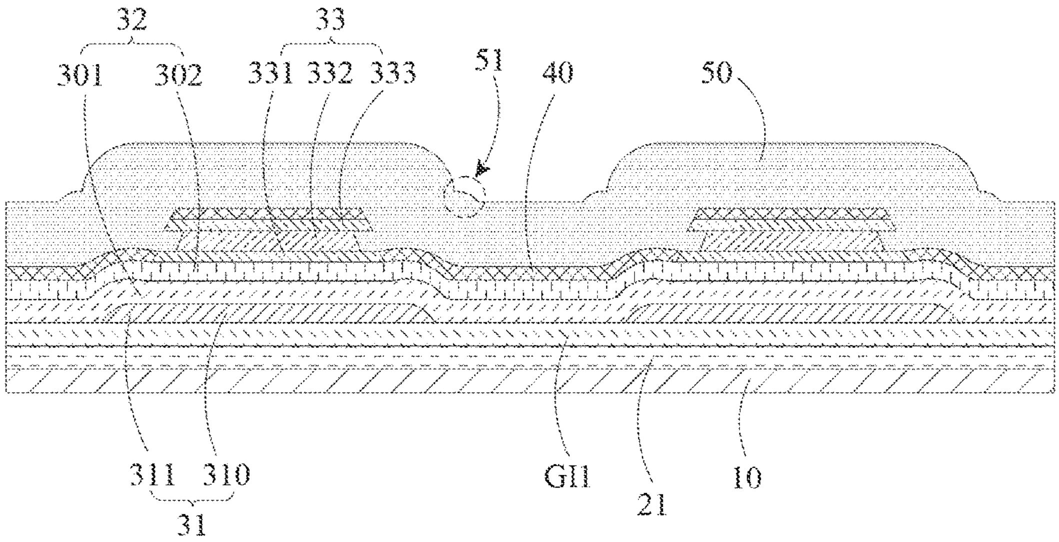
FIG. 6 is a schematic structural view of a second type of the column spacer according to an embodiment of the present application.

In one embodiment, as shown in FIGS. 5 and 6, FIG. 5 is a schematic cross-sectional view of a second type of a display panel along the A-A direction according to an embodiment of the present application, and FIG. 6 is a schematic structural view of a second type of a column spacer according to an embodiment of the present application. A structure of the second type of the display panel shown in FIG. 5 is substantially the same as that of the first type of the display panel shown in FIG. 2, with the following differences: the first metal structure 31 and the first gate metal layer GE1 are disposed in the same layer.

A second gate insulating layer GI2 and an interlayer dielectric layer ILD are arranged between the first metal structure 31 and the second metal layer SD2. The inorganic insulating layer 32 includes a first inorganic insulating layer 301 and a second inorganic insulating layer 302. The second inorganic insulating layer 302 is disposed on a side of the first inorganic insulating layer 301 away from the base substrate 10.

The first inorganic insulating layer 301 is disposed in a same layer as the second gate insulating layer GI2 and made of a same material and a same thickness as that of the second gate insulating layer GI2. The first inorganic insulating layer 301 and the second gate insulating layer GI2 can be formed by using a same inorganic material and prepared by a same vapor deposition process.

The second inorganic insulating layer 302 is disposed in a same layer as the interlayer dielectric layer ILD and made of a same material and a same thickness as that of the interlayer dielectric layer ILD. The second inorganic insulating layer 302 and the interlayer dielectric layer ILD can be formed by using a same inorganic material and prepared by a same vapor deposition process.

Compared with the first type of the column spacer shown in FIG. 3, the inorganic insulating layer 32 in the second type of the column spacer shown in FIG. 6 includes the first inorganic insulating layer 301 and the second inorganic insulating layer 302 each having a thickness greater than a thickness of the inorganic insulating layer 32 of the first type of the column spacer shown in FIG. 3, so that a thickness between the first metal structure 31 and the second metal structure 33 is increased. After the second inorganic insulating layer 302 is deposited on the first inorganic insulating layer 301, the second inorganic insulating layer 302 can reduce a height difference between a first portion 321 and a second portion 322 of the inorganic insulating layer 32, thereby reducing a thickness of the protruding structure 51 and making the thickness of the protruding structure 51 less than a thickness of the protruding structure 51 in the first type of the column spacer shown in FIG. 3.

Figure 7:
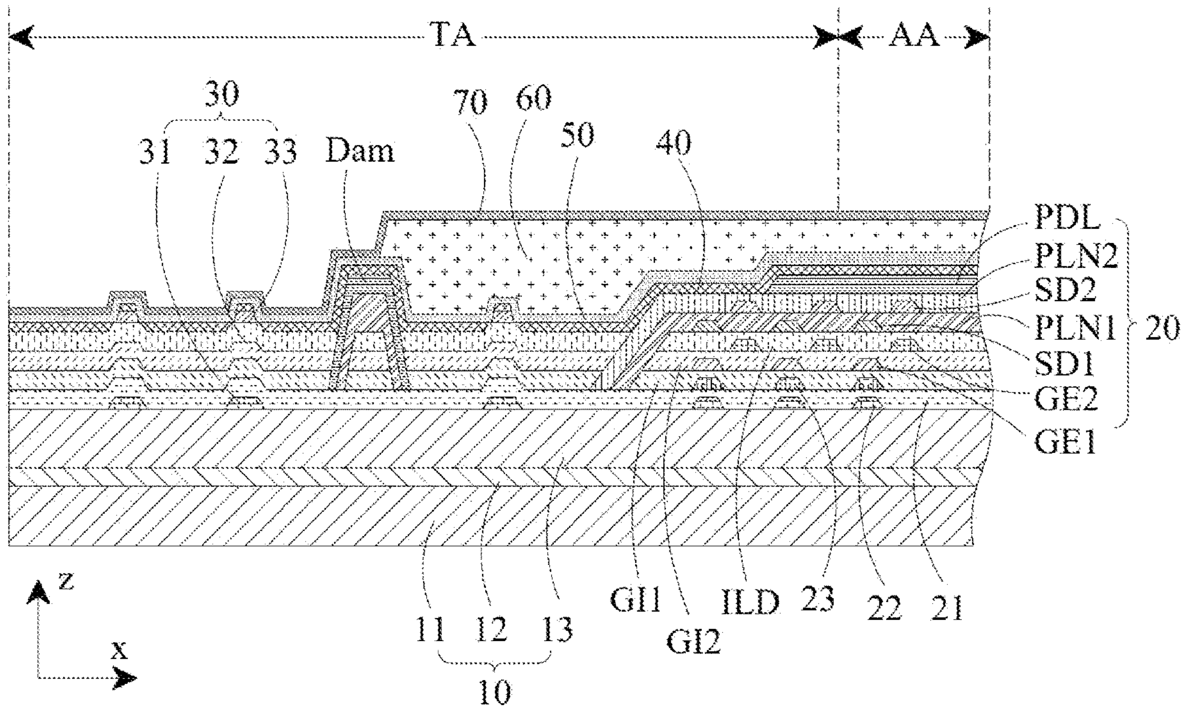
FIG. 7 is a schematic cross-sectional view of a third type of the display panel in the A-A direction according to an embodiment of the present application.
Figure 8:
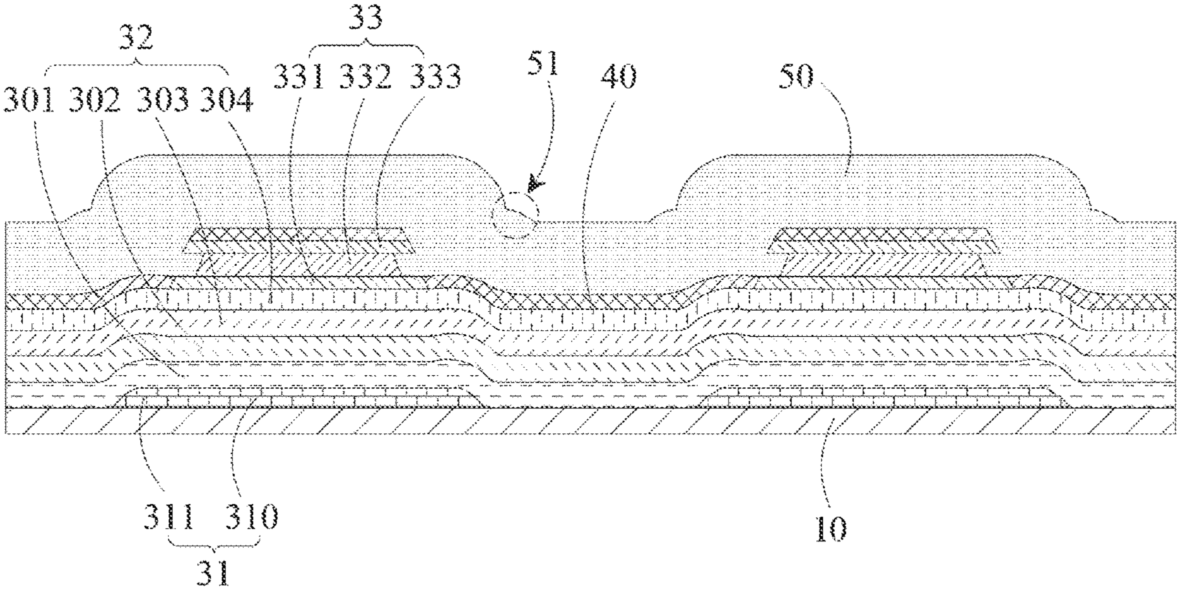
FIG. 8 is a schematic structural view of a third type of the column spacer according to an embodiment of the present application.

In one embodiment, as shown in FIGS. 7 and 8, FIG. 7 is a schematic cross-sectional view of a third type of the display panel along the A-A direction according to an embodiment of the present application, and FIG. 8 is a schematic structural view of a third type of the column spacer according to an embodiment of the present application, with the following differences:

The driver circuit layer 20 includes a shielding metal layer 22, a semiconductor layer 23, a first gate metal layer GE1, a second gate insulating layer GI2, a second gate metal layer GE2, an interlayer dielectric layer ILD, a first metal layer SD1, a first planarization layer PLN1, a second metal layer SD2, and a second planarization layer PLN2 that are sequentially laminated on the base substrate 10. The first metal structure 31 is disposed in a same layer as any one of the shielding metal layer 22, the first gate metal layer GE1, and the second gate metal layer GE2. The second metal structure 33 is disposed in a same layer as the first metal layer SD1 or the second metal layer SD2.

In one embodiment, as shown in FIG. 8, the first metal structure 31 is disposed in a same layer as the shielding metal layer 22 and made of a same material and a same thickness as that of the shielding metal layer 22.

In an embodiment of the present application, the semiconductor layer 23 is made of a material including any one of polysilicon, amorphous silicon, or metal oxide semiconductor material.

As shown in FIG. 8, the shielding metal layer 22 is disposed on the base substrate 10 and covered by the buffer layer 21. A buffer layer 21, a first gate insulating layer GI, a second gate insulating layer GI2, and the interlayer dielectric layer ILD are disposed between the shielding metal layer 22 and the second metal layer SD2.

The inorganic insulating layer 32 includes a first inorganic insulating layer 301, a second inorganic insulating layer 302, a third inorganic insulating layer 303, and a fourth inorganic insulating layer 304 that are laminated in sequence. The first inorganic insulating layer 301 and the buffer layer 21 are arranged in a same layer and made of a same material. The second inorganic insulating layer 302 and the first gate insulating layer GI are arranged in a same layer and made of a same material. The third inorganic insulating layer 303 and the second gate insulating layer G2 are arranged in a same layer and made of a same material. The fourth inorganic insulating layer 304 and the interlayer dielectric layer ILD are arranged in a same layer and made of a same material.

Compared with the second type of the column spacer shown in FIG. 6, the inorganic insulating layer 32 of the third type of the column spacer shown in FIG. 8 includes the first inorganic insulating layer 301, the second inorganic insulating layer 302, and the third inorganic insulating layer 303 each having a thickness greater than a thickness of the inorganic insulating layer 32 of the second type of the column spacer shown in FIG. 6, so that a thickness between the first metal structure 31 and the second metal structure 33 is further increased. After the second inorganic insulating layer 302 and the third inorganic insulating layer 303 are deposited on the first inorganic insulating layer 301, the second inorganic insulating layer 302 and the third inorganic insulating layer 303 can further reduce a height difference between a first portion 321 and a second portion 322 of the inorganic insulating layer 32, thereby reducing a thickness of the protruding structure 51 and making the thickness of the protruding structure 51 less than a thickness of the protruding structure 51 of the second type of the column spacer shown in FIG. 6.

In one embodiment, the second metal structure 33 is disposed in a same layer as the first metal layer SD1 and made of a same material and a same thickness as that of the first metal layer SD1. Alternatively, the second metal structure 33 can be disposed in a same layer and include a same material and film layers as one of the first gate metal layer GE1, the second gate metal layer GE2, or the shielding metal layer 22.

In one embodiment, the display panel may also be provided with only one metal layer and one gate metal layer. For example, the display panel may be provided with a first metal layer SD1 and a first gate metal layer GE1. The first metal structure 31 may be disposed in a same layer as one of the first gate metal layer GE1 or the shielding metal layer 22, and a material and a film structure used therefor are the same. The second metal structure 33 may be disposed in a same layer as the first metal layer SD1 and made of a same material and a same film layer structure as the first metal layer SD1.

Referring to FIGS. 2 and 8, a distance between the first metal structure 31 and the second metal structure 33 is related to a thickness of the inorganic insulating layer 32. The greater the distance between the first metal structure 31 and the second metal structure 33 is, the greater a number of insulating layers included in the inorganic insulating layer 32 is. Therefore, the thickness of the inorganic insulating layer 32 becomes greater, and the thickness of the protruding structure 51 formed on the first inorganic encapsulation layer 50 becomes smaller. Conversely, the lesser the distance between the first metal structure 31 and the second metal structure 33 is, the lesser the number of the insulating layers included in the inorganic insulating layer 32 is. Therefore, the thickness of the inorganic insulating layer 32 becomes smaller, and the thickness of the protruding structure 51 formed on the first inorganic encapsulation layer 50 becomes greater.

Further, the display panel further includes a retaining wall Dam disposed on the substrate, and the retaining wall Dam is disposed in the transition area TA.

In one embodiment, the driver circuit layer 20 further includes an organic layer PDL, a first planarization layer PLN1, and a second planarization layer PLN2. The organic layer PDL is provided with a plurality of pixel openings, and the organic light-emitting material layer in the light-emitting layer 40 may be formed in the pixel openings. The retaining wall Dam can be made of a same material as the organic layers PLN1, PLN2, and PDL, and can be prepared by a same film-forming process as the organic layer PDL.

The retaining wall Dam structure may be composed of the organic layer PDL, the first planarization layer PLN1, and the second planarization layer PLN2, or may be composed of a single or several film layers, which is not limited here. If a third planarization layer PLN3 and the like are developed in subsequent technologies, it can also be added to the Dam structure, which is not limited here.

In one embodiment, the retaining wall Dam may be formed by laminating an inorganic layer and an organic layer. For example, the retaining wall Dam may be composed of at least two layers of the first gate insulating layer GI1, the second gate insulating layer GI2, the interlayer dielectric layer ILD, the first planarization layer PLN1, the second planarization layer PLN2, or the organic layer PDL laminated together.

The column spacers 30 disposed relative to each of a side of the retaining wall Dam close to the display area AA and a side of the retaining wall Dam away from the display area AA, respectively.

Figure 9:
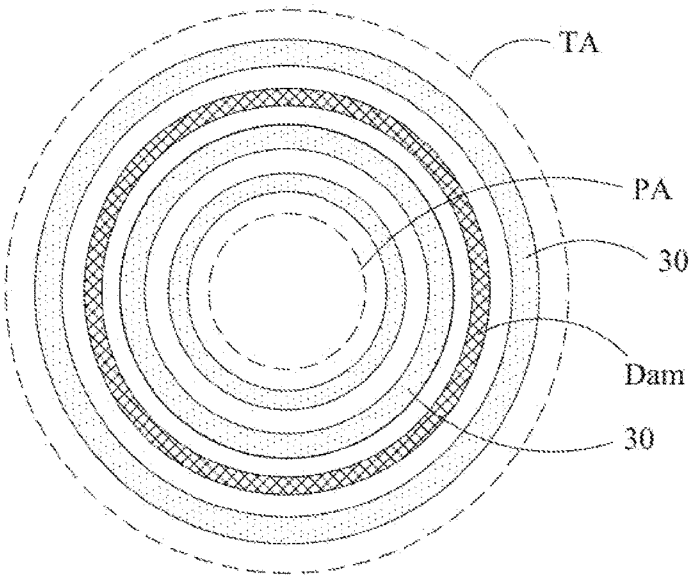
FIG. 9 is a schematic plan view of the transition area and a photosensitive area according to an embodiment of the present application.

As shown in FIG. 9, which is a schematic plan view of the transition area and a photosensitive area according to an embodiment of the present application, each of the retaining wall Dam and the column spacer 30 is annular in structure and is disposed around a periphery of the photosensitive area PA.

In one embodiment, one column spacer 30 is disposed relative to the side of the retaining wall Dam close to the display area AA, and two column spacers 30 disposed relative to the side of the retaining wall Dam away from the display area AA. In other embodiments, a number of the column spacers 30 disposed relative to any side of the retaining wall Dam may be one, or two or more, which is not limited here.

As shown in FIG. 2, the display panel further includes an organic encapsulation layer 60 and a second inorganic encapsulation layer 70 that are sequentially laminated on the first inorganic encapsulation layer 50. The organic encapsulation layer 60 is retained by the retaining wall Dam and is disposed relative to the side of the retaining wall Dam close to the display area AA. The second inorganic encapsulation layer 70 covers the organic encapsulation layer 60 and the first inorganic encapsulation layer 50 in the transition area TA.

In the embodiment of the present application, a distance between an upper surface of the retaining wall Dam and the upper surface of the base substrate 10 is greater than a distance between the upper surface of the column spacer 30 and the upper surface of the base substrate 10, that is, a height of the retaining wall Dam is greater than a height of the column spacer 30. In this way, the organic encapsulation layer 60 is retained on the side close to the display area AA by the retaining wall Dam, so as to prevent the organic encapsulation layer 60 from overflowing to the transition area TA, resulting in a decrease in an encapsulation effect of the encapsulation layer.

In one embodiment, a distance between the upper surface of the column spacer 30 relative to the side of the retaining wall Dam close to the display area AA and the upper surface of the base substrate 10 is equal to a distance between the upper surface of the column spacer 30 relative to the side of the retaining wall Dam away from the display area AA and the upper surface of the base substrate 10. A width of each of the column spacers 30 in the first direction x is also equal, so that uniformity of the width and height of the s can be ensured, thereby reducing the difficulty of design and manufacturing.

In one embodiment, a distance between adjacent column spacers 30 is greater than or equal to 10 μm and less than or equal to 20 μm. For example, the distance between adjacent column spacers 30 may be 10 μm, 12 μm, 14 lam, 16 μm, 18 μm, or 20 μm. In this way, a problem of lower yield due to too small spacing and insufficient machining accuracy can be prevented, and an increase in a width of the transition area AA due to excessively large spacing that results in a reduction in a screen ratio of the display panel can also be prevented.

Preferably, a plurality of the column spacers 30 arranged at equal distances from each other. In other embodiments, the distance between adjacent column spacers 30 may be unequal.

In one embodiment, a size of the notch 334 of the column spacer 30 located relative to the side of the retaining wall Dam close to the display area AA is equal to a size of the notch 334 of the column spacer 30 located relative to the side of the retaining wall Dam away from the display area AA. The size of the notch 334 includes, but is not limited to, a length, width, and depth of the notch 334.

In one embodiment, a thickness of the protruding structure 51 located relative to the side of the retaining wall Dam close to the display area AA is equal to a thickness of the protruding structure 51 located relative to the side of the retaining wall Dam away from the display area AA.

As shown in FIG. 2, on the side of the retaining wall Dam close to the display area AA, the organic encapsulation layer 60 is made of an organic material and can fill a height difference formed by the first metal structure 31 at the column spacer 30, and a flat surface is formed on a side of the organic encapsulation layer 60 facing away from the base substrate 10. Part of the second inorganic encapsulation layer 70 is disposed flat on a side of the organic encapsulation layer 60 facing away from the substrate 10, and a flat surface may also be formed on a side of the second inorganic encapsulation layer 70 facing away from the base substrate 10.

Figure 4:
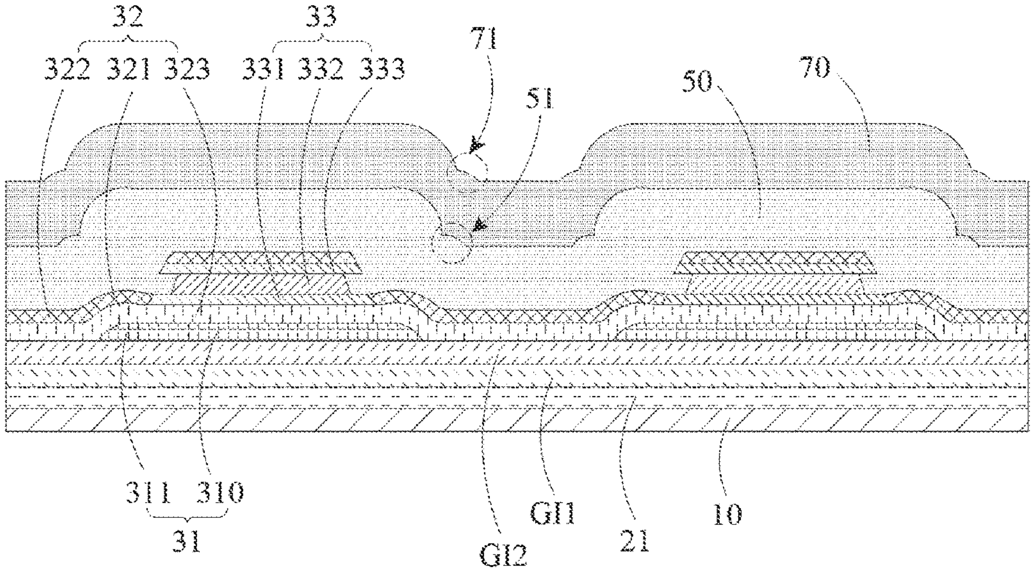
FIG. 4 is a schematic structural view of a first inorganic encapsulation layer and a second inorganic encapsulation layer in a transition area according to an embodiment of the present application.

As shown in FIG. 4, FIG. 4 is a schematic structural view of a first inorganic encapsulation layer and a second inorganic encapsulation layer in a transition area according to an embodiment of the present application. On the side of the retaining wall Dam away from the display area AA, the second inorganic encapsulation layer 70 is disposed on a side of the first inorganic encapsulation layer 50 facing away from the base substrate 10 and is in direct contact with the first inorganic encapsulation layer 50. The second inorganic encapsulation layer 70 forms an auxiliary protruding structure 71 corresponding to the protruding structure 51. In this way, a thickness of the second inorganic encapsulation layer 70 at the column spacer 30 can be increased, thus improving an encapsulation effect of the second inorganic encapsulation layer 70.

During a process of depositing and forming the second inorganic encapsulation layer 70, the inorganic material can fill a thickness difference between the protruding structure 51 and a non-protruding part of first inorganic encapsulation layer 50 around the protruding structure 51 to a certain extent, making a thickness of the auxiliary protruding structure 71 lesser than the thickness of the protruding structure 51.

Figure 10:
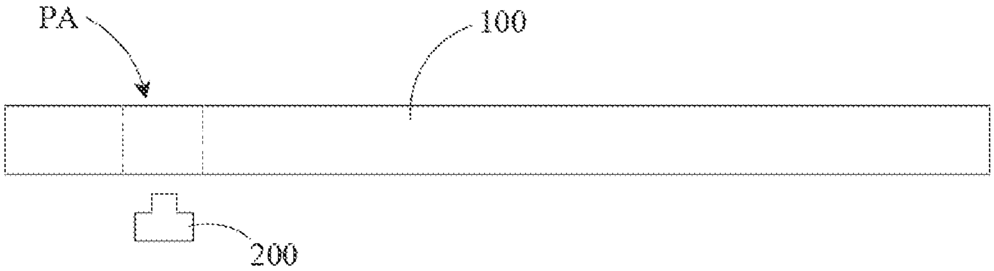
FIG. 10 is a schematic structural view of a display device according to an embodiment of the present application.

According to the display panel provided by the above embodiments of the present application, an embodiment of the present application further provides a display device. As shown in FIG. 10, which is a schematic structural view of the display device according to an embodiment of the present application, the display device includes a photosensitive device 200 and the display panel 100 described in the above-mentioned embodiments. The photosensitive device 200 may be disposed corresponding to the photosensitive area PA of the display panel 100 and may include, but is not limited to, a camera, an infrared sensor, a laser sensor, and the like.

The display device may be a mobile terminal, such as color electronic paper, color electronic book, smart phone, etc. The display device may also be a wearable terminal, such as a smart watch, a smart bracelet, etc. The display device may also be a fixed terminal, such as a color electronic billboard, a color electronic poster, etc.

The embodiments of the present application have advantageous effects as follows: the embodiments of the present application provide a display panel and a display device. The display device includes a photosensitive area, a transition area surrounding the photosensitive area, and a display area surrounding the transition area. The display panel further includes a base substrate, a driver circuit layer, a column spacer, a light-emitting layer, and a first inorganic encapsulation layer. The light-emitting layer is broken at the column spacer in the transition area to prevent moisture from passing through the light-emitting layer in the transition area to permeate into the display area. The column spacer includes a first metal structure, an insulating layer, and a second metal structure that are sequentially laminated on the base substrate. At least one side of the second metal structure forms a notch. An area of the first metal structure is larger than that of the second metal structure, and the first inorganic encapsulation layer forms a protruding structure corresponding to an edge of the first metal structure to increase a thickness of the first inorganic encapsulation layer relative to the column spacer, so that an encapsulation effect of the first inorganic encapsulation layer can be enhanced, and a risk of moisture intrusion into the display area AA which renders a light-emitting material failed can be reduced Accordingly, although the preferred embodiments of this application are disclosed as above, the above preferred embodiments are not intended to limit the application. Those of ordinary skill in the art can make various changes and modifications without departing from the scope of this application. Therefore, the scope of protection of this application is based on the scope defined by the claims.

What is claimed is:

1. A display panel, comprising a photosensitive area configured to obtain and sense external light, a transition area surrounding at least part of the photosensitive area, and a display area surrounding at least part of the transition area, and the display panel further comprising:

a base substrate;

a driver circuit layer disposed on the base substrate;

at least one column spacer disposed on the base substrate and located in the transition area;

a light-emitting layer disposed on a side of the driver circuit layer away from the base substrate and covering the transition area, wherein the light-emitting layer is broken at the at least one column spacer; and a first inorganic encapsulation layer disposed on a side of the light-emitting layer away from the base substrate, wherein the first inorganic encapsulation layer covers the display area and extends to the transition area and at least covers the at least one column spacer;

wherein the at least one column spacer each comprises a first metal structure, an insulating layer, and a second metal structure, the first metal structure is disposed on the base substrate, the insulating layer is disposed on the first metal structure, the second metal structure is disposed on the insulating layer, and at least one side of the second metal structure defines a notch;

wherein the first inorganic encapsulation layer defines a protruding structure corresponding to an edge of the first metal structure;

wherein the first metal structure comprises a main body portion disposed overlapping the second metal structure and an extending portion extending from the main body portion, and a thickness of the extending portion is less than a thickness of the main body portion;

wherein a difference between a first distance and a second distance is greater than a thickness of the first metal structure, the first distance being a distance from an upper surface of the insulating layer at the extending portion to an upper surface of the base substrate, the second distance being a distance from an upper surface of the insulating layer located between the first metal structure and an adjacent first metal structure to the upper surface of the base substrate, and the adjacent first metal structure belonging to another column spacer of the at least one column spacer; and wherein a third distance from an upper surface of the insulating layer at the main body portion to the upper surface of the base substrate is different from the first distance.

2. The display panel of claim 1, wherein a thickness of the insulating layer at the extending portion is greater than a thickness of the insulating layer at the main body portion.

3. The display panel of claim 2, wherein a difference between the third distance and the second distance is equal to the thickness of the first metal structure.

4. The display panel of claim 1, wherein the driver circuit layer comprises a semiconductor layer, a first gate metal layer, a first gate insulating layer, a second gate metal layer, a second gate insulating layer, a first metal layer, and a second metal layer, the semiconductor layer is disposed above the base substrate, the first gate insulating layer is disposed on the semiconductor layer, the first gate metal layer is disposed on the first gate insulating layer, the second gate insulating layer is disposed on the first gate metal layer, the second gate metal layer is disposed on the second gate insulating layer, the first metal layer is disposed above the second gate metal layer, and the second metal layer is disposed above the first metal layer;

wherein the first metal structure is disposed in a same layer as the first gate metal layer or the second gate metal layer, and the second metal structure is disposed in a same layer as the first metal layer or the second metal layer.

5. The display panel of claim 1, wherein the driver circuit layer comprises a shielding metal layer, a semiconductor layer, a first gate metal layer, a first gate insulating layer, a second gate metal layer, a second gate insulating layer, a first metal layer, and a second metal layer, the shielding metal layer is disposed on the base substrate, the semiconductor layer is disposed above the shielding metal layer, the first gate insulating layer is disposed on the semiconductor layer, the first gate metal layer is disposed on the first gate insulating layer, the second gate insulating layer is disposed on the first gate metal layer, the second gate metal layer is disposed on the second gate insulating layer, the first metal layer is disposed above the second gate metal layer, and the second metal layer is disposed above the first metal layer;

wherein the first metal structure and one of the shielding metal layer, the first gate metal layer, and the second gate metal layer are disposed in a same layer, and the second metal structure is disposed in a same layer as the first metal layer or the second metal layer.

6. The display panel of claim 5, wherein the smaller a distance between the first metal structure and the second metal structure is, the greater a thickness of the protruding structure is.

7. The display panel of claim 5, wherein the second metal structure comprises a first metal material layer, a second metal material layer, and a third metal material layer, the second metal material layer is disposed on the first metal material layer, and the third metal material layer is disposed on the second metal material layer, wherein a width of the second metal material layer is less than both a width of the first metal material layer and a width of the third metal material layer.

8. The display panel of claim 1, wherein the display panel comprises a retaining wall disposed on the base substrate and located in the transition area;

wherein the at least one column spacer comprises at least two column spacers, one or more of the at least two column spacers are disposed relative to a side of the retaining wall close to the display area, and remaining of the at least two column spacers are disposed relative to a side of the retaining wall away from the display area.

9. The display panel of claim 8, wherein a distance between an upper surface of the one or more column spacers disposed relative to the side of the retaining wall close to the display area and an upper surface of the base substrate is equal to a distance between an upper surface of the remaining of the at least two column spacers disposed relative to the side of the retaining wall away from the display area and the upper surface of the base substrate.

10. The display panel of claim 8, further comprising an organic encapsulation layer and a second inorganic encapsulation layer, the organic encapsulation layer is disposed on the first inorganic encapsulation layer, and the second inorganic encapsulation layer is disposed on the organic encapsulation layer, wherein the organic encapsulation layer is disposed relative to the side of the retaining wall close to the display area;

wherein part of the second inorganic encapsulation layer is disposed flat on the organic encapsulation layer relative to the side of the retaining wall close to the display area, and part of the second inorganic encapsulation layer is disposed on the first inorganic encapsulation layer relative to the side of the retaining wall away from the display area, wherein the second inorganic encapsulation layer defines an auxiliary protruding structure corresponding to the protruding structure.

11. The display panel of claim 10, wherein a thickness of the auxiliary protruding structure is less than a thickness of the protruding structure.

12. The display panel of claim 1, wherein the base substrate and the driver circuit layer together define a through hole in the photosensitive area.

13. A display device, comprising a photosensitive device and a display panel comprising a photosensitive area configured to obtain and sense external light, a transition area surrounding at least part of the photosensitive area, and a display area surrounding at least part of the transition area, wherein the display panel further comprises:

a base substrate;

a driver circuit layer disposed on the base substrate;

at least one column spacer disposed on the base substrate and located in the transition area;

a light-emitting layer disposed on a side of the driver circuit layer away from the base substrate and covering the transition area, wherein the light-emitting layer is broken at the at least one column spacer; and a first inorganic encapsulation layer disposed on a side of the light-emitting layer away from the base substrate, wherein the first inorganic encapsulation layer covers the display area and extends to the transition area and at least covers the at least one column spacer;

wherein the at least one column spacer each comprises a first metal structure, an insulating layer, and a second metal structure, the first metal structure is disposed on the base substrate, the insulating layer is disposed on the first metal structure, the second metal structure is disposed on the insulating layer, and at least one side of the second metal structure defines a notch;

wherein the first inorganic encapsulation layer defines a protruding structure corresponding to an edge of the first metal structure;

wherein the first metal structure comprises a main body portion disposed overlapping the second metal structure and an extending portion extending from the main body portion, and a thickness of the extending portion is less than a thickness of the main body portion;

wherein a difference between a first distance and a second distance is greater than a thickness of the first metal structure, the first distance being a distance from an upper surface of the insulating layer at the extending portion to an upper surface of the base substrate, the second distance being a distance from an upper surface of the insulating layer located between the first metal structure and an adjacent first metal structure to the upper surface of the base substrate, and the adjacent first metal structure belonging to another column spacer of the at least one column spacer; and wherein a third distance from an upper surface of the insulating layer at the main body portion to the upper surface of the base substrate is different from the first distance.

14. The display device of claim 13, wherein a thickness of the insulating layer at the extending portion is greater than a thickness of the insulating layer at the main body portion.

15. The display device of claim 14, wherein a difference between the third distance and the second distance is equal to the thickness of the first metal structure.

16. The display device of claim 13, wherein the driver circuit layer comprises a semiconductor layer, a first gate metal layer, a first gate insulating layer, a second gate metal layer, a second gate insulating layer, a first metal layer, and a second metal layer, the semiconductor layer is disposed above the base substrate, the first gate insulating layer is disposed on the semiconductor layer, the first gate metal layer is disposed on the first gate insulating layer, the second gate insulating layer is disposed on the first gate metal layer, the second gate metal layer is disposed on the second gate insulating layer, the first metal layer is disposed above the second gate metal layer, and the second metal layer is disposed above the first metal layer;

wherein the first metal structure is disposed in a same layer as the first gate metal layer or the second gate metal layer, and the second metal structure is disposed in a same layer as the first metal layer or the second metal layer.

17. The display device of claim 13, wherein the driver circuit layer comprises a shielding metal layer, a semiconductor layer, a first gate metal layer, a first gate insulating layer, a second gate metal layer, a second gate insulating layer, a first metal layer, and a second metal layer, the shielding metal layer is disposed on the base substrate, the semiconductor layer is disposed above the shielding metal layer, the first gate insulating layer is disposed on the semiconductor layer, the first gate metal layer is disposed on the first gate insulating layer, the second gate insulating layer is disposed on the first gate metal layer, the second gate metal layer is disposed on the second gate insulating layer, the first metal layer is disposed above the second gate metal layer, and the second metal layer is disposed above the first metal layer;

wherein the first metal structure and one of the shielding metal layer, the first gate metal layer, and the second gate metal layer are disposed in a same layer, and the second metal structure is disposed in a same layer as the first metal layer or the second metal layer.

18. The display device of claim 17, wherein the smaller a distance between the first metal structure and the second metal structure is, the greater a thickness of the protruding structure is.

* * * * *